US012771475B2

(12) United States Patent
Sidhakaran et al.

(10) Patent No.: US 12,771,475 B2
(45) Date of Patent: Oct. 20, 2026

(54) PRIORI BIT PATTERN INDEXED ERROR COUNTS FOR ACCELERATED LINK EQUALIZATION TRAINING

(71) Applicant: NVIDIA Corporation, Santa Clara, CA (US)

(72) Inventors: Sunil Sidhakaran, Los Altos, CA (US); Billy Zhong, Waltham, MA (US)

(73) Assignee: NVIDIA Corporation, Santa Clara, CA (US)

( * ) Notice: Subject to any disclaimer, the term of this patent is extended or adjusted under 35 U.S.C. 154(b) by 19 days.

(21) Appl. No.: 18/972,382

(22) Filed: Dec. 6, 2024

(65) Prior Publication Data

US 2026/0163674 A1 Jun. 11, 2026

(51) Int. Cl.

| | |
|---|---|
| ***H04L 5/12*** | (2006.01) |
| ***H03M 13/29*** | (2006.01) |
| ***H03M 13/39*** | (2006.01) |
| ***H04L 1/00*** | (2006.01) |

(52) U.S. Cl.

CPC ...... *H04L 1/0054* (2013.01); *H03M 13/2957* (2013.01); *H03M 13/3905* (2013.01)

(58) Field of Classification Search

CPC ............ H04L 1/0054; H03M 13/2957; H03M 13/3905

USPC ................ 375/262, 260, 259, 219, 295, 316

See application file for complete search history.

(56) References Cited

U.S. PATENT DOCUMENTS

| | | | | |
|---|---|---|---|---|
| 2006/0008279 A1* | 1/2006 | Chiang | ............. | H04B 10/6971 398/202 |
| 2019/0097846 A1* | 3/2019 | Sreeramaneni | ... | H04L 25/03146 |
| 2024/0303144 A1* | 9/2024 | Ock | ...................... | G06F 11/076 |

* cited by examiner

*Primary Examiner* — Zewdu A Kassa

(74) *Attorney, Agent, or Firm* — Lowenstein Sandler LLP

(57) ABSTRACT

A system includes a memory device and one or more processing devices operatively coupled to the memory device via a memory channel. The processing device(s) cause data to be received over the memory channel from the memory device, where the data includes known multi-bit patterns. The processing device(s) sweep the data over voltage and time to generate eye diagram data. The processing device(s) detect errors at identified cursors of the eye diagram data, where each identified cursor corresponds to a known multi-bit pattern within a set of previously transmitted bits. The processing device(s) store counts of each detected error associated with a respective known multi-bit pattern. The processing device(s) determine, using the counts, a plurality of decision feedback equalizer (DFE) coefficients to be employed in receiving unknown data over the memory channel.

20 Claims, 11 Drawing Sheets

800

```
Psuedo Code
      # eye represents 3D matrix of size volt_range x pi_range x 2^m
      # m represents number of bits in sequence to index
      # run 2D shmoo and record per-sequence data in parallel
805   for vstep in volt_range
810     for pi_step in pi_range
815       Transmit PRBS pattern
820       eye(vstep,pi_step,:) = error counts across sequences (2^m)

      # calculate optimal vertical shifts per sequence
      for seq in 2^m
825     h(seq) = vref such that area(eye > vref) == area(eye < vref)

830   optimal_shifts = A^-1*h  # A matrix is enumerated sequences

      # optimal_shifts now has determined vref information
835   dfe = convert_h_to_dfe_tap(optimal_shifts)
```

FIG. 8

PRIORI BIT PATTERN INDEXED ERROR COUNTS FOR ACCELERATED LINK EQUALIZATION TRAINING

TECHNICAL FIELD

Embodiments of the disclosure are generally related to memory sub-systems, and more specifically, relate to a priori bit pattern indexed error counts for accelerated link equalization training.

BACKGROUND

Transmitting data over a data channel that employs accelerated link equalization can lead to significant errors. Such data channels can include memory channels in memory sub-systems, e.g., between a memory controller and a memory device, as well as data channels that exist between high-speed serializer-deserializer (SERDES) devices, among other high-speed communication link devices, such as across a Ground-Referenced Signaling interconnect (GRS). For example, pulses that encode data degrade as a result of inter-symbol interference (ISI) during digital communications, e.g., where sub-pulses (or sidelobes) of a main data pulse do not cancel out, making it difficult to read the digital data. These sub-pulses (or sidelobes) correlate to various cursor taps and equalization can be performed to vary decision feedback equalizer (DFE) coefficients in order to sufficiently cancel out these sub-pulses.

BRIEF DESCRIPTION OF THE DRAWINGS

The present disclosure will be understood more fully from the detailed description given below and from the accompanying drawings of some embodiments of the disclosure.

FIG. 8 is a method, in pseudo code, for generating and employing error counts associated with known bit patterns in previously transmitted bits to determine DFE coefficients for equalization according to memory channel embodiments.

DETAILED DESCRIPTION

Figure 1:
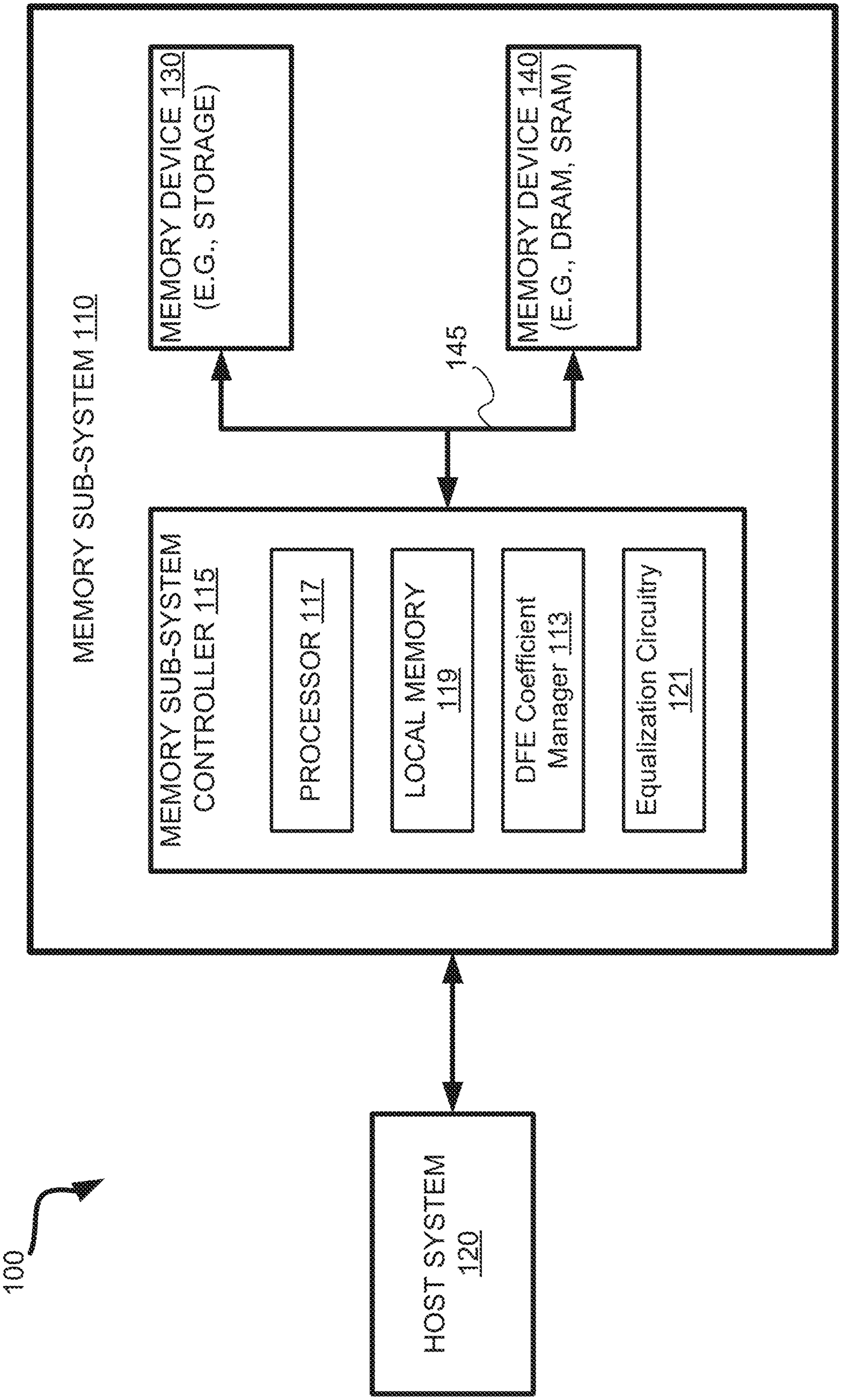
FIG. 1 is a simplified block diagram of an example computing system that includes a memory sub-system in accordance with some embodiments.

Embodiments of the present disclosure are directed to employing a priori (or known) bit pattern indexed error counts for accelerated link equalization training of digital data received over a high-speed data channel such as a memory channel, a SERDES data channel, or other data queue (DQ) channel. Normally, in current devices, equalization training is performed through nested sweeps across voltage and time for each DFE coefficient because the equalization is activated for the training and DFE coefficients are expressly associated with each nested sweep of each channel. As speeds increase in data channels, the ISI of digital transmission increases, and the time required to perform the training extends to minutes during which error-ridden data can be received that will have to corrected or retransmitted. These issues can be compounded in data channels in which many varying sidelobes of primary digital pulses are to be canceled. Without accurately and quickly training DFE coefficients to effectuate such cancellation, user quality of service (QoS) can be significantly impacted from poor performance of high-speed devices and systems that rely on accurate data channels.

Aspects of the present disclosure address the above and other deficiencies by turning off equalization of the data channel and the performing equalization training using a disclosed method by which a compacted sweeping of received data produces error counts in eye diagram data associated with known bit patterns in previously transmitted bits. Once these error counts are captured, the error counts can be used in determining DFE coefficients, which can be employed in receiving unknown data over the data channel after equalization is turned back on.

For example, one or more processing devices of a high-speed communication device or system can turn off equalization of a DQ channel (e.g., a data channel, a memory channel, or the like) and sweep across voltage and phase dimensions of the data for each known multi-bit pattern. In embodiments, respective identified cursors correspond to phase steps or passage of time. Once the DFE coefficients are determined as disclosed herein, the processing device(s) can turn the equalization of the memory channel (or data channel) back on. The processing device(s) can then cause a DFE equalizer of the DQ channel to use the DFE coefficients in receiving unknown data over the DQ channel.

For example, in at least one embodiment, data is transmitted over a memory channel and received by one or more processing devices of a memory sub-system. Those processing device(s) can cause data to be received over the memory channel from a memory device. In embodiments, the data includes known multi-bit patterns. The processing device(s) can sweep the data over voltage and time to generate eye diagram data and then detect errors at identified cursors of the eye diagram data. In embodiments, each identified cursor corresponds to a known multi-bit pattern within a set of previously transmitted bits. The processing device(s) can store, e.g., in a data structure, counts of each detected error associated with a respective known multi-bit pattern of the set of previously transmitted bits. The processing device(s) can determine, using the counts stored in the data structure for the previously transmitted bits, multiple DFE coefficients to be employed in receiving unknown data over the memory channel. In embodiments, the memory channel is one of two Double Data Rate 5 (DDR5) memory channels and the known multi-bit patterns are pseudo-random binary sequences (PRBS).

In at least one other embodiment, the data is transmitted over a data channel between communication link devices (such as SERDES or GRS-based devices). Accordingly, in embodiments, one or more processing devices of a SERDES device causes data to be received over the data channel from the second communication link device, where the data includes known multi-bit patterns. The processing device(s) can sweep the data over voltage and time to generate eye diagram data and detect errors at identified cursors of the eye diagram data. In embodiments, each identified cursor corresponds to a known multi-bit pattern within a set of previously transmitted bits. The processing device(s) can buffer counts of each detected error associated with a respective known multi-bit pattern of the set of previously transmitted bits, e.g., within registers, counters, or a type of cache or main memory of the communication link device. The processing device(s) can determine, using the buffered counts for the previously transmitted bits, multiple DFE coefficients to be employed in receiving unknown data over the data channel.

Therefore, advantages of the systems, devices, and methods implemented in accordance with some embodiments of the present disclosure include, but are not limited to, the ability to significantly speed up and increase accuracy of DFE coefficient training based on receipt of known bit patterns over a variety of DQ channels. Other advantages will be apparent to those skilled in the art of digital data equalization over high-speed data or DQ channels discussed hereinafter.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe or CXL bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and/or synchronous dynamic random access memory (SDRAM). In at least one embodiment, the memory device 140 is double data rate synchronous dynamic random access memory (DDR SDRAM) such as DDR5 SDRAM.

The memory device 130 can, for example, be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117) or processing devices configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the one or more processing device(s) include a host processor, which is located within the host system 120, to store and update the data structure in a main memory of the host system and the memory sub-system controller 115 that controls access, by the host system 120, to the memory device 140 and contains equalization circuitry 121, which can include a DFE equalizer. Thus, the operations disclosed herein can be performed by the host system 120 or by a combination of the sub-system controller 115 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system such as within the host system 120).

In embodiments, a memory bus 145 includes a memory channel coupled between the controller 115 and the memory device 140, where the memory channel is an example of the disclosed data channels (or DQ channels) that can be categorized as data links. Thus, the memory bus 145 can include two DDR5 memory channels when the memory device 140 is a DDR5 SRAM device. In at least some embodiments, the controller 115 further includes a DFE coefficient manager 113 configured to train DFE coefficients on known multi-bit patterns while equalization is turned off and then cause the equalization to be turned back on to use the trained DFE coefficients on unknown data received over the memory channel. In embodiments, turning equalization on or off includes activating or deactivating the equalization circuitry 121 within the controller 115, as will be discussed in more detail below. In embodiments, the DFE coefficient training is accelerated link equalization training over a high-speed data bus or channel.

In general, the memory sub-system controller 115 can receive commands or operations from the host system 120 and can convert the commands or operations into instructions or appropriate commands to achieve the desired access to the memory devices 130 and 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130 and 140. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system.

Figure 2:
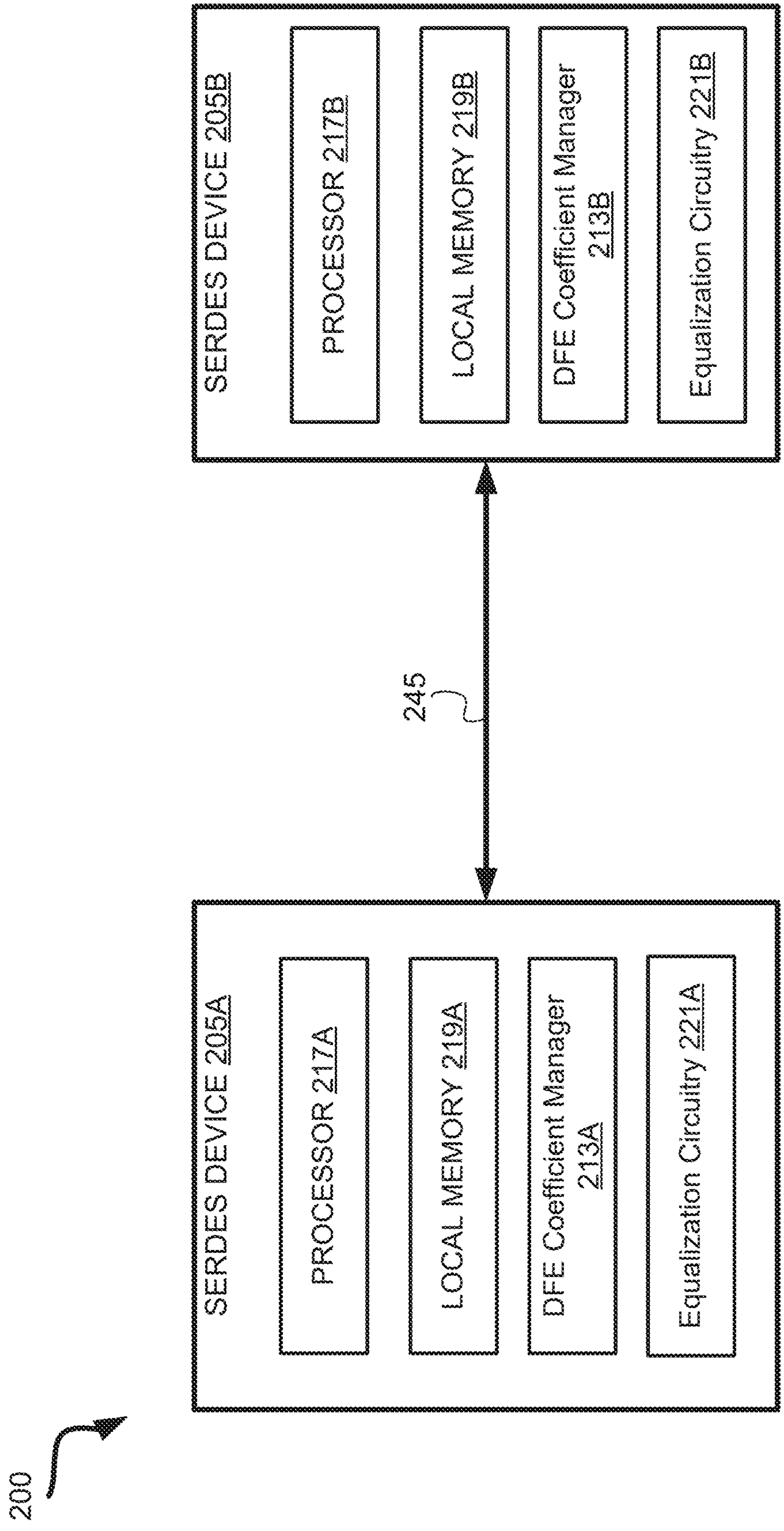
FIG. 2 is a simplified block diagram of an example network communication system including at least two SERDES devices according to an embodiment.

FIG. 2 is a simplified block diagram of an example network communication system 200 including at least two SERDES devices according to an embodiment. For example, the network communication system 100B can include a first SERDES device 205A and a second SERDES device 205B coupled to each other over a SERDES bus 245 that includes a data channel, also referred to as a data queue (DQ) or data line channel.

In some embodiments, the first SERDES device 205A includes a processor 217A, a local memory 219A, a DFE coefficient manager 213A, and equalization circuitry 221A. The processor 217A can include one or more processing devices and can be configured similarly to the processor 117 (FIG. 1), e.g., configured to execute instructions stored in the local memory 219A. In embodiments, the DFE coefficient manager 213A is configured to, while detecting eye diagram data over the data channel, train DFE coefficients on known multi-bit patterns while equalization is turned off. The DFE coefficient manager 213A can then cause the equalization to be turned back on to use the trained DFE coefficients on unknown data received over the data channel. In embodiments, turning equalization on or off includes activating or deactivating the equalization circuitry 261A, within the first SERDES device 205A. In embodiments, the equalization circuitry 261A includes include a DFE equalizer. In embodiments, the DFE coefficient training is accelerated link equalization training over a high-speed data bus or channel.

In some embodiments, the second SERDES device 205B includes a processor 217B, a local memory 219B, a DFE coefficient manager 213B, and equalization circuitry 261B. The processor 217B can include one or more processing devices and can be configured similarly to the processor 117 (FIG. 1), e.g., configured to execute instructions stored in the local memory 219B. In embodiments, the DFE coefficient manager 213B is configured to, while detecting eye diagram data over the data channel, train DFE coefficients on known multi-bit patterns while equalization is turned off. The DFE coefficient manager 213B can then cause the equalization to be turned back on to use the trained DFE coefficients on unknown data received over the data channel. In embodiments, turning equalization on or off includes activating or deactivating the equalization circuitry 261B, within the second SERDES device 205B. In embodiments, the equalization circuitry 261B includes include a DFE equalizer. In embodiments, the DFE coefficient training is accelerated link equalization training over a high-speed data bus or channel.

Figure 3:
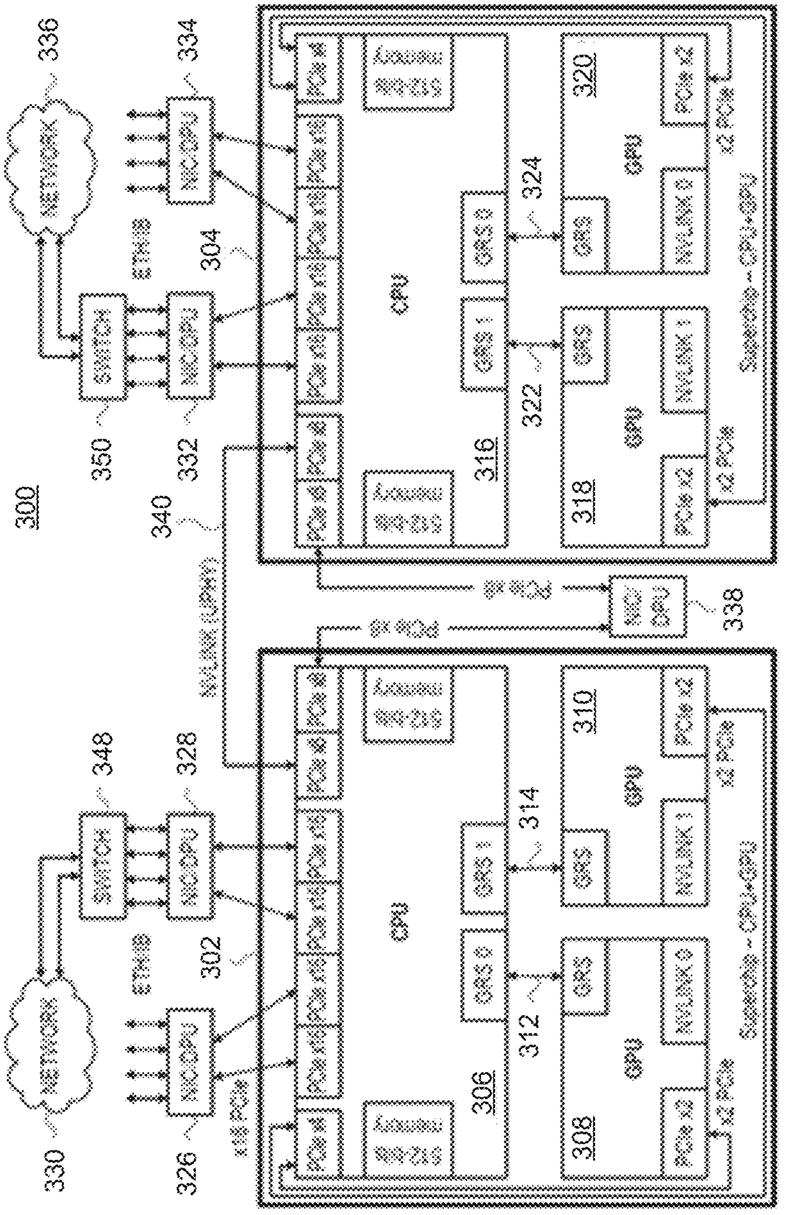
FIG. 3 is a block diagram that schematically illustrates a computing system, e.g., a data center or a High-Performance Computing (HPC) cluster, in accordance with some embodiments.

FIG. 3 is a block diagram that schematically illustrates a computing system 300, e.g., a data center or a High-Performance Computing (HPC) cluster, in accordance with some embodiments. System 300 includes a plurality of subsystems, e.g. multiple processing devices coupled to each other, multiple network devices, and multiple networks, according to at least one embodiment. Computing system 300 is designed with multiple integrated circuits (referred to as processing devices), where each integrated circuit can include one or more CPUs and GPUs, forming a powerful and flexible architecture.

The various processing devices are interconnected via an NVLink™ or other high-speed interconnect, enabling high-speed communication between the subsystems, and are also connected through a network interface controller (NIC) or data processing unit (DPU) to ensure efficient data transfer across computing system 300 and to one or more external networks 330, 336. In the present example, system 300 comprises a packet switch 348 that connects NIC/DPU 328 to network 330, and a packet switch 350 that connects NIC/DPU 332 to network 336.

The coupling of processing devices through NVLink allows for seamless data exchange and parallel processing, enhancing overall computational performance. The processing devices are connected to multiple networks through one or more network interface cards (NICs) or DPUs, enabling the system to handle complex, multi-network tasks with high bandwidth and low latency. This configuration is highly suitable for demanding applications that require significant processing power, such as artificial intelligence (AI), machine learning (ML), and data-intensive computing, while ensuring robust connectivity and scalability across various networked environments. The integrated circuits of the computing system 300 can include one or more CPUs and one or more graphics processing units (GPUs).

FIG. 3 also demonstrates an example architecture of a multi-GPU architecture. As illustrated, the computing system 300 includes a processing device 302 with a multi-GPU architecture. In particular, processing device 302 may be a system-on-chip and includes multiple subsystems such as a CPU 306, a GPU 308, and a GPU 310. CPU 306 can be coupled to GPU 308 via a die-to-die (D2D) or chip-to-chip (C2C) interconnect 312, such as a Ground-Referenced Signaling interconnect (GRS interconnect). CPU 306 can be coupled to GPU 310 via a D2D or C2C interconnect 314. CPU 306 can also couple to GPU 308 and GPU 310 via PCIe interconnects.

CPU 306 can be coupled to one or more NICs or DPUs, which are coupled to one or more networks. For example, as illustrated in FIG. 3, CPU 306 is coupled to a first NIC/DPU 326, which is coupled to a network 330. CPU 306 is also coupled to a second NIC/DPU 328, which is coupled to network 330 via switch 348. NIC/DPU 326 and NIC/DPU 328 can be coupled to network 330 over Ethernet (ETH), NVLINK or InfiniBand (IB) connections, for example.

Computing system 300 also includes a processing device 304 with a multi-GPU architecture. In particular, processing device 304 includes multiple subsystems including a CPU 316, a GPU 318, and a GPU 320. CPU 316 can be coupled to GPU 318 via an D2D or C2C interconnect 322. CPU 316 can be coupled to GPU 320 via a D2D or C2C interconnect 324. CPU 316 can also couple to GPU 318 and GPU 320 via PCIe interconnects. CPU 316 can be coupled to one or more NICs or DPUs, which are coupled to one or more networks. For example, as illustrated in FIG. 3, CPU 316 is coupled to a first NIC/DPU 332, which is coupled to a network 336. CPU 316 is also coupled to a second NIC/DPU 334, which is coupled to network 336 via switch 350. NIC/DPU 332 and NIC/DPU 334 can be coupled to network 336 over Ethernet (ETH), NVLINK or InfiniBand (IB) connections.

In at least one embodiment, processing device 302 and processing device 304 can communication with each other via a NIC/DPU 338, such as over PCIe interconnects. Processing device 302 and processing device 304 can also communicate with each other over a high-bandwidth communication interconnects 340, such as an NVLink interconnect or other high-speed interconnects. The packet switches in FIG. 3 may include, for example, Nvidia Quantum-2 switches. The NICs/DPUs in the figure may comprise, for example, Nvidia Bluefield DPUs.

In some embodiments, each GRS component (GRS, GRS0, GRS1) of the GRS interconnects can operate, in connection with a respective CPU or GPU, as either of the first SERDES device 205A or the second SERDES device 205B illustrated and described with reference to FIG. 2. Thus, the respective CPU or GPU can operate as the processor 217A or 217B, which can include operation of the DFE coefficient manager 213A or 213B, respectively. In such embodiments, the C2C interconnects 312, 314, 322, and/or 324 would represent the SERDES bus 245 (FIG. 2) or other data channel between high-speed interconnects.

Figure 4:
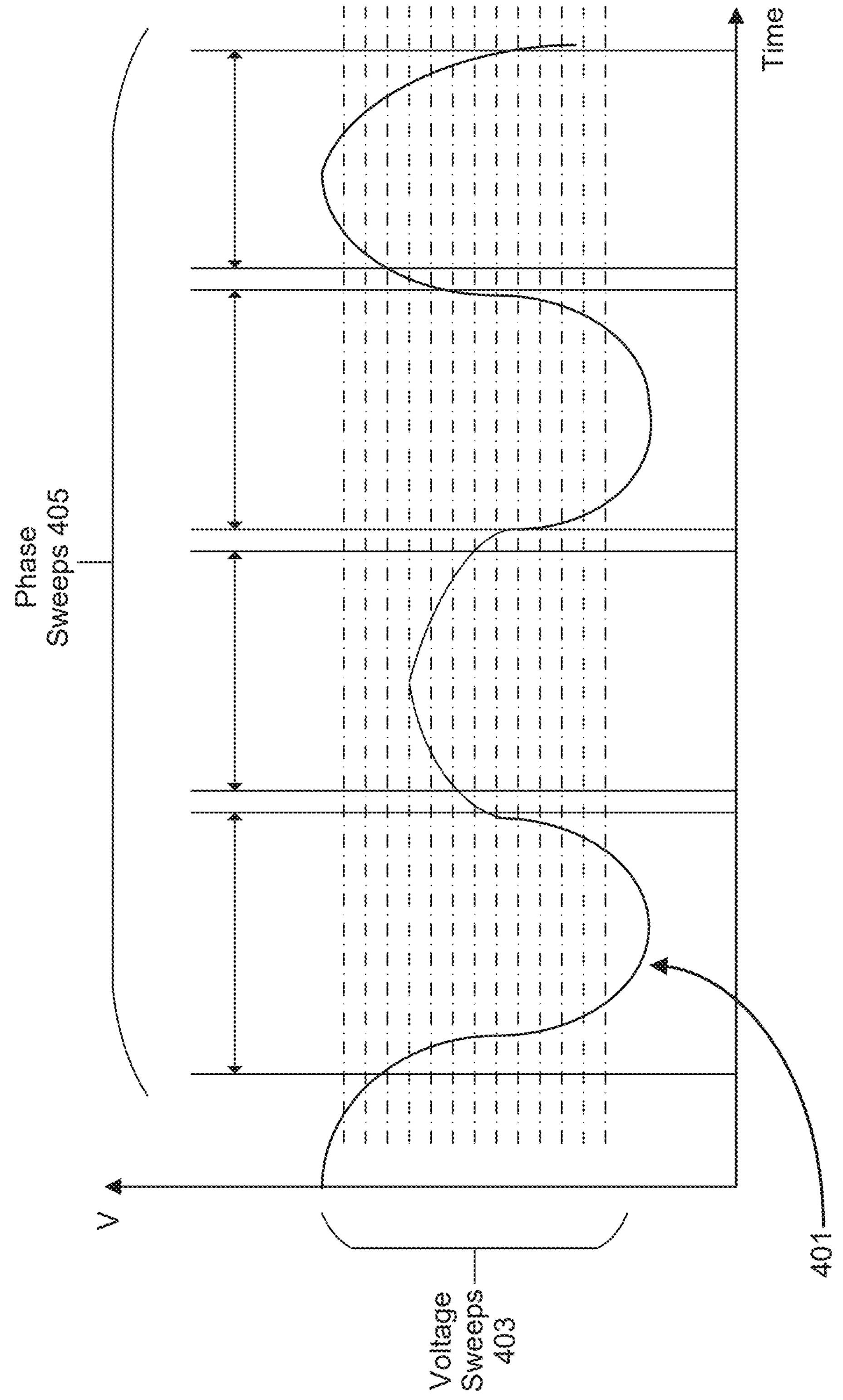
FIG. 4 is a graphical depiction of voltage sweeps and phase sweeps performed on received data that generates eye diagram data from which error counts are detected according to some embodiments.

FIG. 4 is a graphical depiction of voltage sweeps 403 and phase sweeps 405 performed on received data 401 that generates eye diagram data from which error counts are detected according to some embodiments. In some embodiments, the one or more processing devices of the controller 115 (FIG. 1) or the SERDES device 205A (FIG. 2) performing these two-dimensional (2D) sweeps (over voltage and time) while equalization circuitry is deactivated, thus turning off equalization while sweeping the data received over the data or DQ channel. In embodiments, performing such a 2D sweep over voltage and time is performed over discrete voltage levels and phase steps to generate the eye diagram data, eye diagrams of which are illustrated and will be discussed in more detail with reference to FIG. 6.

While simplified eye diagrams are illustrated and discussed herein, the eye diagrams generated within the disclosed eye diagram data can correspond to different possible signal levels in pulse amplitude modulation (PAM) multi-bit schemes and to different sets of bits. So, for example, a PAM4 signal includes four amplitude levels and each eye diagram represents the signal integrity and timing window between adjacent amplitude levels, allowing evaluation of noise margin and signal clarity that facilitates DFE coefficient generation.

For example, each eye diagram can include vertical openings and horizontal openings. The vertical opening of each eye diagram can represent the signal-to-noise margin, indicating how well-separated the different levels are. The horizontal opening can represent the timing margin, showing the amount of time the signal remains stable at each level before transitioning.

In embodiments, these multi-level eye diagrams help engineers evaluate jitter, noise, inter-symbol interference (ISI), and crosstalk within the data channel. Thus, by examining the width and clarity of each eye, the one or more processing devices can assess the quality of the signal and identify potential issues in high-speed links. For example, the clarity and openness of each eye diagram relates directly to a bit error rate (BER). Closed or distorted eyes in a multi-level eye diagram indicate higher error rates, while open and clear eyes signify a robust signal.

Figure 5:
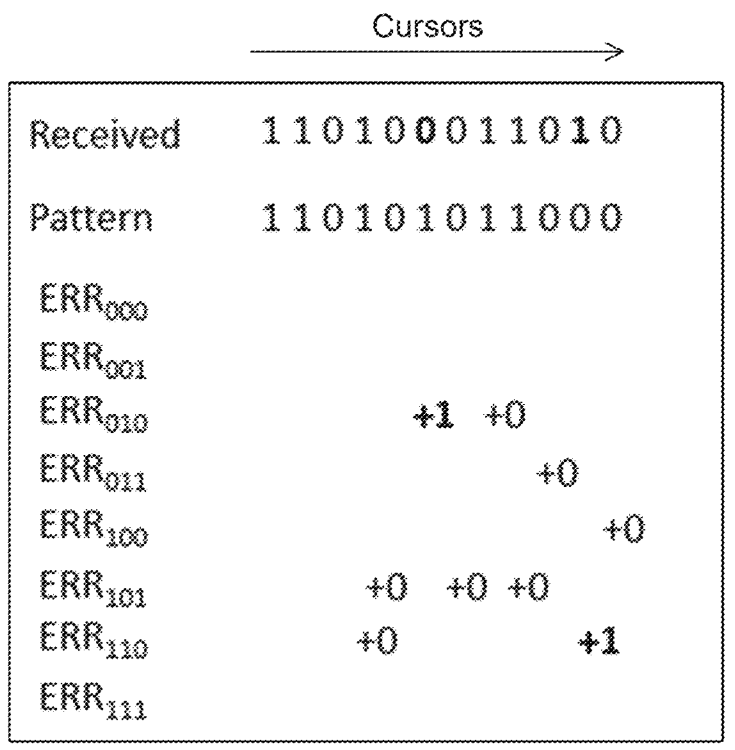
FIG. 5 is a graphical depiction of received data, the known bit pattern, and error counts being indexed based on the known bit patterns in previously transmitted bits according to some embodiments.

FIG. 5 is a graphical depiction of received data, the known bit pattern, and error counts being indexed based on the known bit patterns in previously transmitted bits according to some embodiments. In various embodiments, the one or more processing devices can detect errors at identified cursors of the eye diagram data, e.g., of each respective eye diagram associated with different bit patterns. In embodiments, each identified cursor corresponds to a known multi-bit pattern within a set of previously transmitted bits. So, for example, because the bit patterns being transmitted are known, a priori, before transmission, an error in any of the transmitted bits can be detected.

As illustrated, the sixth cursor was detected as a "0" value (which is bolded) rather than a "1" value that was transmitted and so an error counter associated with the known multi-bit pattern (010) within a set of previously transmitted bits is incremented. Similarly, the eleventh cursor received a "1" value (which is bolded) rather than a "0" value that was transmitted and so an error counter associated with the known multi-bit pattern (110) within a set of previously transmitted bits is incremented.

As can be seen, the one or more processing devices can tract an error count (e.g., using a unique error counter) for each known multi-bit pattern, where the set of previously transmitted bits are three in number in this example. While the available three-bit patterns are illustrated by way of example, different known multi-bit patterns could be employed such as two-bit or four-bit patterns. Also, the error counts from the unique error counters for each multi-bit pattern can be associated with and/or stored in a data structure stored in local memory (e.g., of the controller 115 or the first SERDES device 205A), in a main memory or the like, such as the memory device 140 accessible by the host system 120.

In other embodiments, the one or more processing devices buffers counts of each detected error associated with a respective known multi-bit pattern of the set of previously transmitted bits. For example, the one or more processing devices can buffer the error counts (e.g., from the unique error counters) in hardware registers, cache, or other such buffers, including in SRAM or tightly coupled memory (TCO) in various embodiments.

Figure 6:
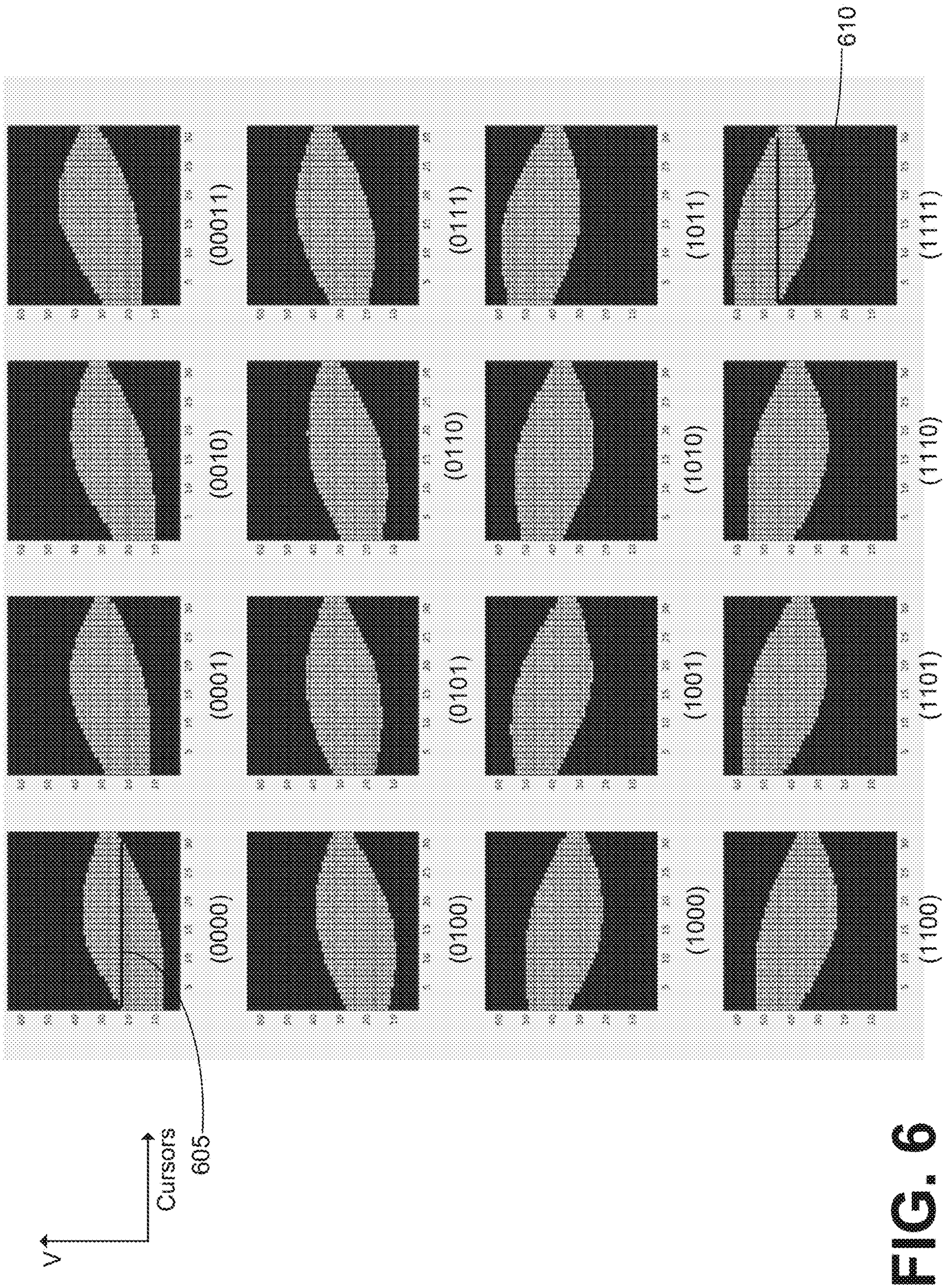
FIG. 6 is a set of images depicting eye diagram data for known bit patterns useable to determine a voltage level that bisects an area of an eye associated with each respective known bit pattern according to some embodiments.

FIG. 6 is a set of images depicting eye diagram data for known bit patterns useable to determine a voltage level that bisects an area of an eye associated with each respective known bit pattern according to some embodiments. For example, based on a four bit, known multi-bit pattern, illustrated are sixteen eye diagrams generated by 2D sweeping of received data over a data channel. Each eye diagram is plotted with voltage along a Y-axis (vertical axis) and cursor value along an X-axis (horizontal axis), where the cursors generally correspond to passage of time. In embodiments, related to each eye diagram, the dark squares represent errors while the light squares represent valid data, e.g., cursors at a voltage level without errors.

As can be seen, the more zero values that are in a given four-bit pattern, the lower the eye diagram and so the lower voltage levels being detected. As more one values are transmitted in any given four-bit pattern, the eye diagram increases in voltage, where some cursors tend to increase in voltage at different rates, causing the multi-bit eye diagrams to be skewed in different ways and for which DFE coefficient tuning can help correct and clarify each respective eye diagram.

Thus, in at least some embodiments, to determine the DFE coefficients, the one or more processing devices determine, based on the error counts for each known multi-bit pattern, an area across an eye of the eye diagram data. The one or more processing devices can store, within a vector, for each known multi-bit pattern, a voltage level that bisects the area of the eye. The one or more processing devices can calculate the DFE coefficients by matrix multiplication of an inverse of a matrix, which includes the known multi-bit patterns, and the vector. In other embodiments, the DFE coefficients are determined by matrix multiplication of a pseudo-inverse of the matrix and the vector or use of other numerical techniques between the matrix and the vector. Only by way of example, a line 605 across the eye diagram associated with bits (0000) can identify a voltage level (e.g., approximately 23 volts) that bisects the area of the 0000 eye diagram. Further, a line 610 across the eye diagram associated with bits (1111) can identify a voltage level (e.g., approximately 45 volts) that bisects the aera of the 1111 eye diagram. Each of these voltage levels can be stored in a vector (e.g., h) that can then be used in calculating the DFE coefficient values.

The voltage level for each multi-bit eye diagram can be determined in a variety of ways according to differing embodiments. In one embodiment, the one or more processing devices determine the voltage level for each multi-bit pattern as a voltage level where a first number of the identified cursors without errors that are above the voltage level matches a second number of the identified cursors without errors that are below the voltage level. This voltage level can be determined, for example, by scanning rows across the eye diagram from a bottom to the top (or vice versa) and gathering cumulative numbers of valid data points. Once all valid data points are cumulatively added together, the row that is positioned at the 50% level of those valid data points would be the bisecting line of the area of that eye or eye diagram.

According to another embodiment, the one or more processing devices are further to determine the voltage level for each known multi-bit pattern as, while scanning in rows across the eye diagram data, the voltage level corresponding to a longest row of identified cursors without errors. For example, the row that has the most light squares with valid data would be the longest row and corresponding voltage level for that row can identify the voltage level.

Figure 7:
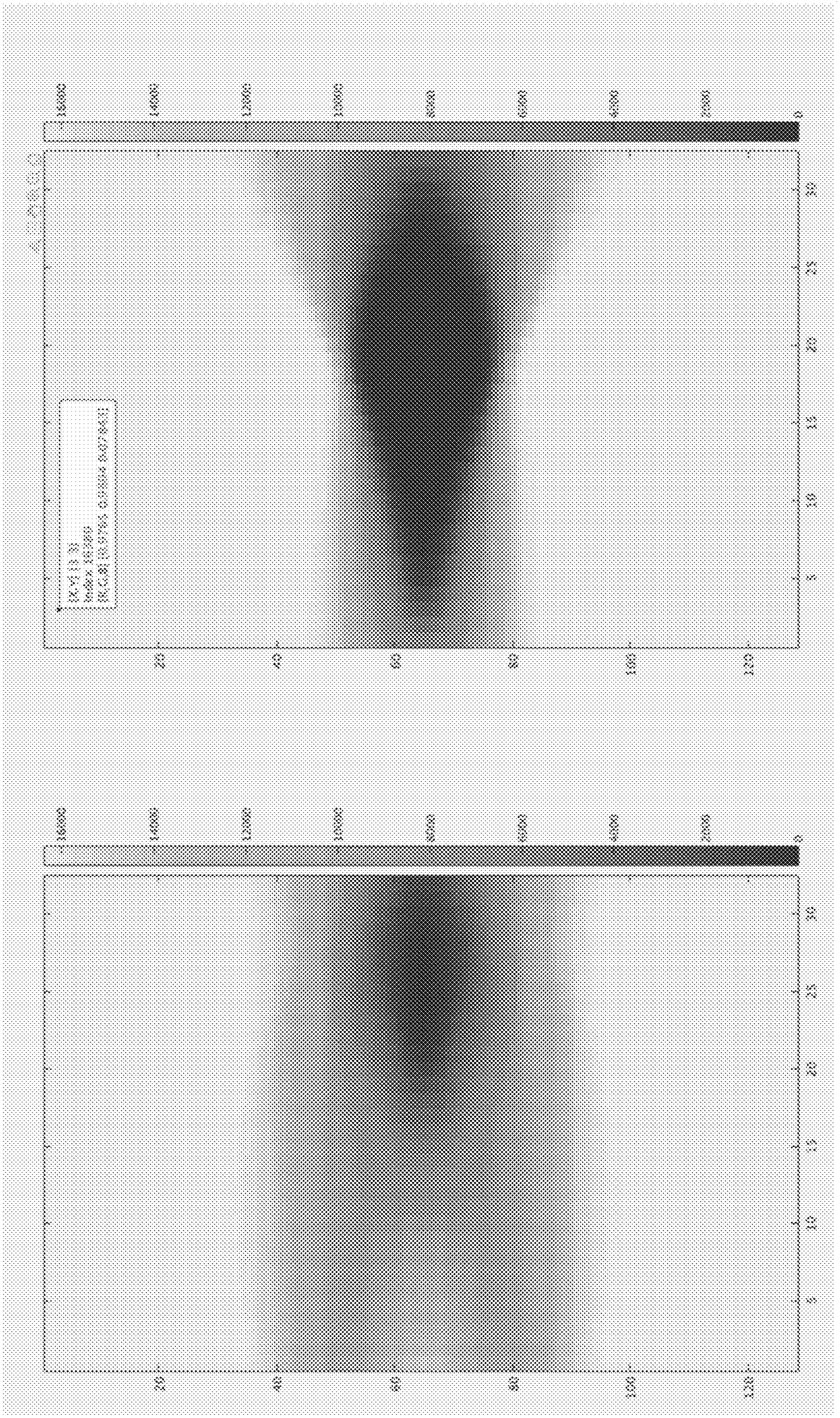
FIG. 7 is a set of images illustrating plotted eye diagram data before and after equalization once DFE coefficients have been trained according to disclosed embodiments.

FIG. 7 is a set of images illustrating plotted eye diagram data before and after equalization once DFE coefficients have been trained according to disclosed embodiments. For example, the eye diagram captured on the left is an actual image from an original eye diagram from a 2D sweep of received channel data. In contrast, the eye diagram captured on the right was captured of the eye diagram after error count training disclosed herein. These eye diagrams are illustrated only by way of example to show the significant improvement in the clarity and contrast between the eye area of valid data and areas outside of the eye without valid data, e.g., resulting in error counts.

FIG. 8 is a method 800, in pseudo code, for generating and employing error counts associated with known bit patterns in previously transmitted bits to determine DFE coefficients for equalization according to memory channel embodiments. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the DFE coefficient manager 113 in connection with the processor 117 and/or the host system 120 (FIG. 1), e.g., as executed by one or more processing devices. In other embodiments, the method 800 is performed by the DFE coefficient manager 213A in connection with the processor 217A, e.g., as executed by one or more processing devices of communication link devices such as the first SERDES device 150A (FIG. 2) or at any GRS of the C2C interconnects 312, 314, 322, and/or 324 (FIG. 3). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In embodiments, the eye diagram data discussed herein include a three-dimensional (3D) matrix with dimensions including a voltage range of the received data, a phase interpolation (PI) range of the received data, and of m number of bits in the PRBS pattern (e.g., known multi-bit pattern) that is being detected. Sweeping the received data can be performed in 2D (voltage and time/phase) for each known multi-bit pattern in parallel.

At operation 805, the processing logic defines a voltage step for the 2D sweep.

At operation 810, the processing logic defines a phase step for the 2D sweep.

At operation 815, the processing logic causes the known multi-bit pattern to be transmitted, which can include retrieving predetermined data from the memory device 130 or 140 or requesting predetermined data from the second SERDES device 250B.

At operation 820, the processing logic performs the 2D sweep over the voltage and phase for the PRBS pattern. Thus, operations 815 and 820 can be performed multiple time to sweep test the m different known multi-bit patterns depending on the number of m bits in each pattern.

At operations 825, 830, and 835, the processing logic determines optimal vertical shifts for each known bit pattern or sequence. For example, at operation 825, the processing logic determines the voltage level (Vref) that bisects the area of the eye (or eye diagram) for the particular known multi-bit pattern, as was discussed in detail with reference to FIG. 4. Additionally, the processing logic can populate the vector, h, with each respective voltage level for the various known bit patterns. A matrix, A, can be populated with the known bit patterns.

At operation 830, the processing logic determines shifts to the DFE coefficients by matrix multiplication of an inverse of the A matrix, which includes the known multi-bit patterns, and the vector, which can be expressed as $A^{-1}h$. Table 1 illustrates an example of matrix A and vector h that could be associated with the known multi-bit patterns of FIG. 4.

TABLE 1

| A | | | | h |
|---|---|---|---|---|
| −1 | −1 | −1 | −1 | 11 |
| −1 | −1 | −1 | +1 | 7 |
| −1 | −1 | +1 | −1 | 8 |
| −1 | −1 | +1 | +1 | 3 |
| −1 | +1 | −1 | −1 | 9 |
| −1 | +1 | −1 | +1 | 5 |
| −1 | +1 | +1 | −1 | 6 |
| −1 | +1 | +1 | +1 | 1 |

TABLE 1-continued

| A | | | | h |
|---|---|---|---|---|
| +1 | −1 | −1 | −1 | −2 |
| +1 | −1 | −1 | +1 | −7 |
| +1 | −1 | +1 | −1 | −6 |
| +1 | −1 | +1 | +1 | −1 |
| +1 | +1 | −1 | −1 | −5 |
| +1 | +1 | −1 | +1 | −9 |
| +1 | +1 | +1 | −1 | −8 |
| +1 | +1 | +1 | +1 | −12 |

At operation 835, the processing logic determines new DFE coefficients by applying the shifts, determined at operation 830, to the DFE coefficients. The processing logic can then apply the new DFE coefficients to the DFE equalizer of the equalization circuitry of a communications device for operation of the equalization circuitry after being reactivated for receipt of unknown multi-bit data.

In some embodiments, the method 800 can be performed to determine coarse DFE coefficients, e.g., DFE coefficient values that are generally correct after initial training without DFE equalization turned on. In such embodiments, the processing logic can perform a nested sweep, e.g., while equalization is turned on, using a respective coarse DFE coefficient of each of the coarse DFE coefficients, when sweeping the data. The processing logic can detect further errors in the eye diagram data while performing the nested sweeps at the identified cursors. The processing logic can then generate fine DFE coefficients by updating the coarse DFE coefficients based on the detected further errors. This fine-tuning of the DFE coefficients will take less time than otherwise because the coarse DFE coefficients are now much closer to being tuned but for the disclosed DFE coefficient training.

Figure 9A:
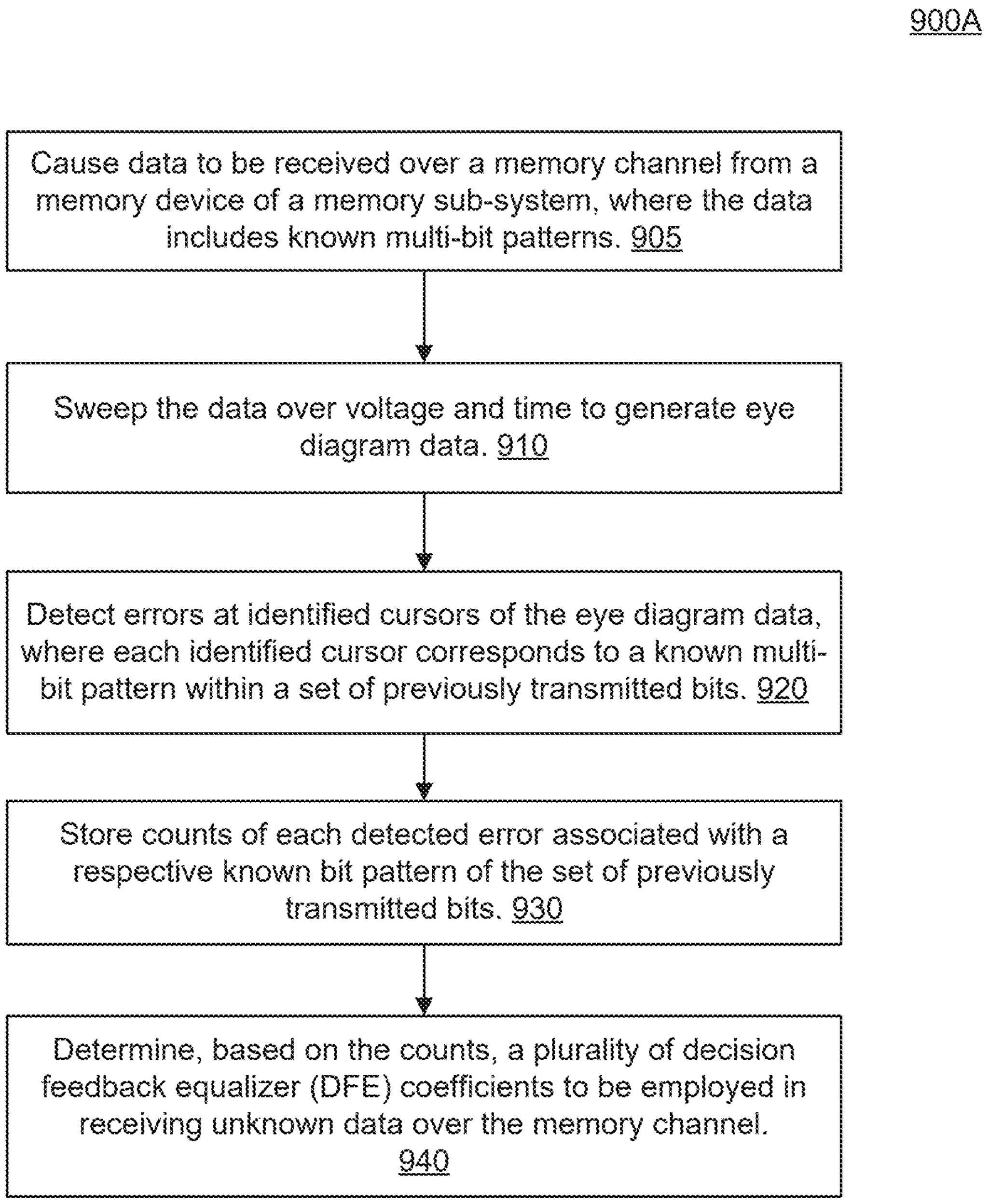
FIG. 9A is a flow diagram of an example method of generating and employing error counts associated with known bit patterns in previously transmitted bits to determine DFE coefficients for equalization according to memory channel embodiments.

FIG. 9A is a flow diagram of an example method 900A of generating and employing error counts associated with known bit patterns in previously transmitted bits to determine DFE coefficients for equalization according to memory channel embodiments. The method 900A can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900A is performed by the DFE coefficient manager 113 in connection with the processor 117 and/or the host system 120 (FIG. 1), e.g., as executed by one or more processing devices. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 905, the processing logic causes data to be received over the memory channel from the memory device, where the data includes known multi-bit patterns.

At operation 910, the processing logic sweeps the data over voltage and time to generate eye diagram data.

At operation 920, the processing logic detects errors at identified cursors of the eye diagram data, wherein each identified cursor corresponds to a known multi-bit pattern within a set of previously transmitted bits.

At operation 930, the processing logic stores counts of each detected error associated with a respective known multi-bit pattern of the set of previously transmitted bits.

At operation 940, the processing logic determines, using the counts, multiple DFE coefficients to be employed in receiving unknown data over the memory channel.

Figure 9B:
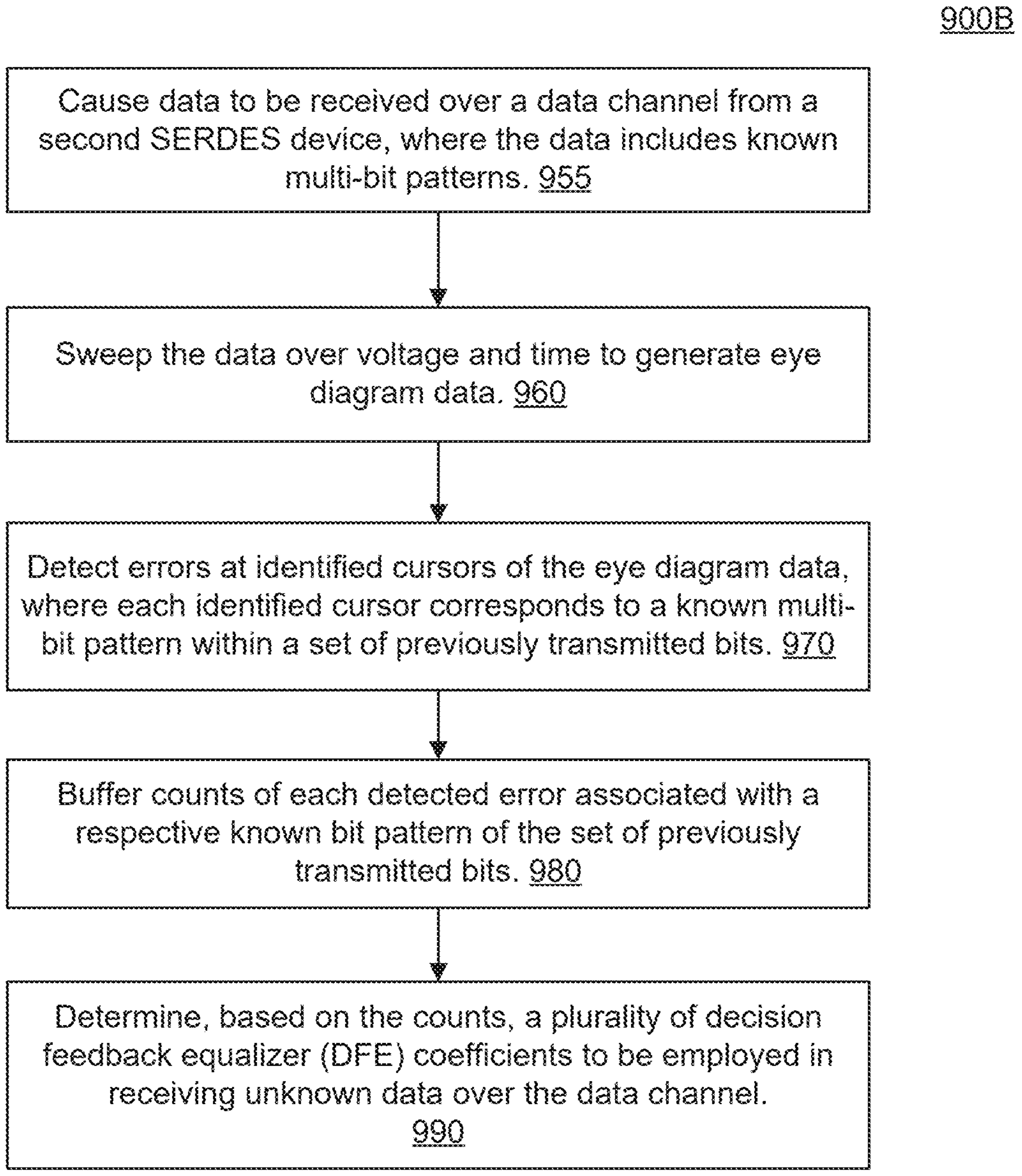
FIG. 9B is a flow diagram of an example method of generating and employing error counts associated with known bit patterns in previously transmitted bits to determine DFE coefficients for equalization according to communication link (e.g., SERDES or GRS) channel embodiments.

FIG. 9B is a flow diagram of an example method 900B of generating and employing error counts associated with known bit patterns in previously transmitted bits to determine DFE coefficients for equalization according to communication link (e.g., SERDES or GRS) channel embodiments. The method 900B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof.

In some embodiments, the method 900B is performed by the DFE coefficient manager 213A in connection with the processor 217A, e.g., as executed by one or more processing devices of the first SERDES device 205A (FIG. 2). In other embodiments, the method 900B is performed by the DFE coefficient manager 213B in connection with the processor 217B, e.g., as executed by one or more processing devices of the second SERDES device 205B (FIG. 2). In still other embodiments, the method 900B is performed by the DFE coefficient manager 213A in connection with the processor 217A, e.g., as executed by one or more processing devices associated with any GRS of the C2C interconnects 312, 314, 322, and/or 324 (FIG. 3). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 955, the processing logic causes data to be received over the data channel from a second communication link device, where the data comprises known multi-bit patterns. Thus, for example, the processing logic resides in the first SERDES device 150A that receives data over the SERDES bus 155 from the second SERDES device 150B.

At operation 960, the processing logic sweeps the data over voltage and time to generate eye diagram data.

At operation 970, the processing logic detects errors at identified cursors of the eye diagram data, wherein each identified cursor corresponds to a known multi-bit pattern within a set of previously transmitted bits.

At operation 980, the processing logic buffers counts of each detected error associated with a respective known multi-bit pattern of the set of previously transmitted bits.

At operation 990, the processing logic determines, using the buffered counts, multiple DFE coefficients to be employed in receiving unknown data over the data channel.

Figure 10:
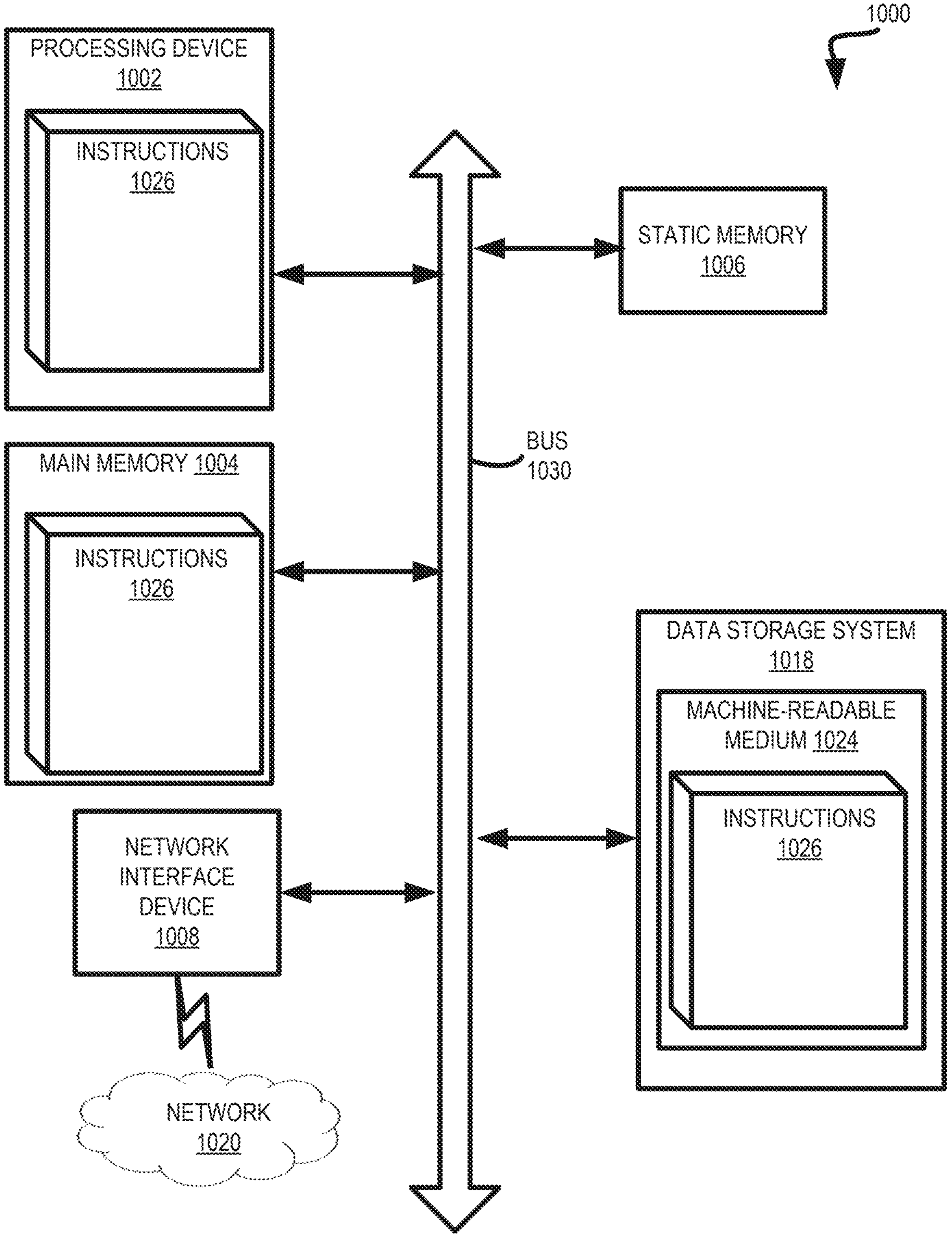
FIG. 10 is a block diagram of an example computer system in which embodiments of the present disclosure can operate.

FIG. 10 illustrates an example machine of a computer system 1000 within which a set of instructions, for causing the machine to perform any one or more of the methodologies discussed herein, can be executed. In some embodiments, the computer system 1000 corresponds to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the controller 115 of FIG. 1), also referred to as control logic herein. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1010 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1028 for performing the operations and steps discussed herein. The computer system 1000 can further include a network interface device 1012 to communicate over the network 1020.

The data storage system 1018 can include a machine-readable storage medium 1024 (also known as a computer-readable medium) on which is stored one or more sets of instructions 1028 or software embodying any one or more of the methodologies or functions described herein. The instructions 1028 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1.

In one embodiment, the instructions 1026 include instructions to implement functionality corresponding to a controller (e.g., the memory sub-system controller 115 of FIG. 1). While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., non-transitory computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory device; and one or more processing devices operatively coupled to the memory device via a memory channel, wherein the one or more processing devices are to:

cause data to be received over the memory channel from the memory device, wherein the data comprises known multi-bit patterns;

sweep the data over voltage and time to generate eye diagram data, wherein, to sweep the data, the one or more processing devices are to:

turn off equalization of the memory channel; and sweep across voltage and phase dimensions of the data for each known multi-bit pattern;

detect errors at identified cursors of the eye diagram data, wherein each identified cursor corresponds to a known multi-bit pattern within a set of previously transmitted bits;

store counts of each detected error associated with a respective known multi-bit pattern of the set of previously transmitted bits; and determine, using the counts, a plurality of decision feedback equalizer (DFE) coefficients to be employed in receiving unknown data over the memory channel.

2. The system of claim 1, wherein the memory channel is one of two Double Data Rate 5 (DDR5) memory channels and the known multi-bit patterns are pseudo-random binary sequences.

3. The system of claim 1, wherein the one or more processing devices comprise:

a host processor, which is located within a host system, to store and update the counts within a data structure stored in a main memory of the host system; and a memory sub-system controller that controls access, by the host system, to the memory device and contains equalization circuitry.

4. The system of claim 1, wherein respective identified cursors correspond to phase steps.

5. The system of claim 4, wherein the one or more processing devices are further to:

turn the equalization of the memory channel back on; and cause a DFE equalizer of the memory channel to use the DFE coefficients in receiving the unknown data over the memory channel.

6. The system of claim 1, wherein, to determine the DFE coefficients, the one or more processing devices are further to:

determine, based on the counts for each known multi-bit pattern, an area across an eye of the eye diagram data;

store, within a vector, for each known multi-bit pattern, a voltage level that bisects the area of the eye; and calculate shifts to the DFE coefficients by matrix multiplication of an inverse of a matrix, which includes the known multi-bit patterns, and the vector.

7. The system of claim 6, wherein the one or more processing devices are further to determine the voltage level for each multi-bit pattern as a voltage level where a first number of the identified cursors without errors that are above the voltage level matches a second number of the identified cursors without errors that are below the voltage level.

8. The system of claim 6, wherein the one or more processing devices are further to determine the voltage level for each known multi-bit pattern as, while scanning in rows across the eye diagram data, the voltage level corresponding to a longest row of identified cursors without errors.

9. The system of claim 6, wherein the DFE coefficients are coarse DFE coefficients and the one or more processing devices are further to:

perform a nested sweep, using a respective coarse DFE coefficient of each of the coarse DFE coefficients, when sweeping the data;

detect further errors in the eye diagram data while performing the nested sweeps at the identified cursors; and generate fine DFE coefficients by updating the coarse DFE coefficients based on the detected further errors.

10. A communication link device comprising:

one or more processing devices operatively coupled to a second communication link device via a data channel, wherein the one or more processing devices are to:

cause data to be received over the data channel from the second communication link device, wherein the data comprises known multi-bit patterns;

sweep the data over voltage and time to generate eye diagram data, wherein, to sweep the data, the one or more processing devices are to:

turn off equalization of the data channel; and sweep across voltage and phase dimensions of the data for each known multi-bit pattern;

detect errors at identified cursors of the eye diagram data, wherein each identified cursor corresponds to a known multi-bit pattern within a set of previously transmitted bits;

buffer counts of each detected error associated with a respective known multi-bit pattern of the set of previously transmitted bits; and determine, using the buffered counts, a plurality of decision feedback equalizer (DFE) coefficients to be employed in receiving unknown data over the data channel.

11. The communication link device of claim 10, wherein respective identified cursors correspond to phase steps.

12. The communication link device of claim 11, wherein the one or more processing devices are further to:

turn the equalization of the data channel back on; and cause a DFE equalizer of the data channel to use the DFE coefficients in receiving the unknown data over the data channel.

13. The communication link device of claim 11, wherein, to determine the DFE coefficients, the one or more processing devices are further to:

determine, based on the counts for each known multi-bit pattern, an area across an eye of the eye diagram data;

store, within a vector, for each known multi-bit pattern, a voltage level that bisects the area of the eye; and calculate shifts to the DFE coefficients by matrix multiplication of an inverse of a matrix, which includes the known multi-bit patterns, and the vector.

14. A method comprising:

causing, by a processing device, data to be received over a memory channel from a memory device of a memory sub-system, wherein the data comprises known multi-bit patterns;

sweeping the data over voltage and time to generate eye diagram data, wherein sweeping the data comprises:

turning off equalization of the memory channel; and sweeping across voltage and phase dimensions of the data for each known multi-bit pattern;

detecting errors at identified cursors of the eye diagram data, wherein each identified cursor corresponds to a known multi-bit pattern within a set of previously transmitted bits;

storing, in a data structure, counts of each detected error associated with a respective known multi-bit pattern of the set of previously transmitted bits; and determining, by the processing device, based on the counts, a plurality of decision feedback equalizer (DFE) coefficients to be employed in receiving unknown data over the memory channel.

15. The method of claim 14, wherein respective identified cursors correspond to phase steps.

16. The method of claim 15, further comprising:

turning the equalization of the memory channel back on; and causing a DFE equalizer of the memory channel to use the DFE coefficients in receiving the unknown data over the memory channel.

17. The method of claim 14, wherein determining the DFE coefficients further comprises:

determining, based on the counts for each known multi-bit pattern, an area across an eye of the eye diagram data;

storing, within a vector, for each known multi-bit pattern, a voltage level that bisects the area of the eye; and calculating shifts to the DFE coefficients by matrix multiplication of an inverse of a matrix, which includes the known multi-bit patterns, and the vector.

18. The method of claim 17, further comprising determining the voltage level for each multi-bit pattern as a voltage level where a first number of the identified cursors without errors that are above the voltage level matches a second number of the identified cursors without errors that are below the voltage level.

19. The method of claim 17, further comprising determining the voltage level for each known multi-bit pattern as, while scanning in rows across the eye diagram data, the voltage level corresponding to a longest row of identified cursors without errors.

20. The method of claim 17, wherein the DFE coefficients are coarse DFE coefficients, the method further comprising:

performing a nested sweep, using a respective coarse DFE coefficient of each of the coarse DFE coefficients, when sweeping the data;

detecting further errors in the eye diagram data while performing the nested sweeps at the identified cursors; and generating fine DFE coefficients by updating the coarse DFE coefficients based on the detected further errors.

* * * * *